US012803265B2

(12) United States Patent
Tanigawa et al.

(10) Patent No.: US 12,803,265 B2
(45) Date of Patent: Nov. 17, 2026

(54) MEASUREMENT APPARATUS, MEASUREMENT SYSTEM, AND PROGRAM

(71) Applicants: Yokogawa Electric Corporation, Musashino (JP); Yokogawa Test & Measurement Corporation, Hachioji (JP)

(72) Inventors: Akira Tanigawa, Hachioji (JP); Hiroyuki Moriyama, Hachioji (JP); Kouichi Kataoka, Hachioji (JP)

(73) Assignees: Yokogawa Electric Corporation, Musashino (JP); Yokogawa Test & Measurement Corporation, Hachioji (JP)

( * ) Notice: Subject to any disclaimer, the term of this patent is extended or adjusted under 35 U.S.C. 154(b) by 162 days.

(21) Appl. No.: 18/811,462

(22) Filed: Aug. 21, 2024

(65) Prior Publication Data

US 2025/0079822 A1 Mar. 6, 2025

(30) Foreign Application Priority Data

Aug. 28, 2023 (JP) ................................ 2023-138434

(51) Int. Cl.
*H02H 3/00* (2006.01)
*G01R 31/56* (2020.01)
*H02H 3/04* (2006.01)

(52) U.S. Cl.
CPC ............ *H02H 3/042* (2013.01); *G01R 31/56* (2020.01)

(58) Field of Classification Search
CPC ...................................................... H02H 3/042
See application file for complete search history.

(56) References Cited

U.S. PATENT DOCUMENTS

| | | | | |
|---|---|---|---|---|
| 7,148,695 | B2 * | 12/2006 | Swope | G01R 19/28 324/522 |
| 9,633,492 | B2 * | 4/2017 | Panko | G07C 5/0808 |
| 10,318,441 | B2 * | 6/2019 | Inoue | G01N 33/0037 |
| 2005/0071689 | A1 * | 3/2005 | Coward | H04Q 1/03 713/300 |
| 2012/0060063 | A1 * | 3/2012 | Sakurai | G06F 9/4406 714/49 |
| 2015/0142345 | A1 * | 5/2015 | Anderson | H04H 20/12 702/59 |
| 2017/0286243 | A1 * | 10/2017 | Breakstone | H04L 67/1097 |

FOREIGN PATENT DOCUMENTS

| | | |
|---|---|---|
| JP | 2002-125373 A | 4/2002 |
| JP | 2015-102901 A | 6/2015 |

* cited by examiner

*Primary Examiner* — Stephen W Jackson
(74) *Attorney, Agent, or Firm* — WHDA, LLP

(57) ABSTRACT

It would be helpful to enable a frame controller to support multiple-slot-width modules. A measurement apparatus includes a plurality of slots to which one or more modules are connectable, a power supply manager configured to control powering the modules connected to the plurality of slots, and a display configured to display measurement signals acquired by the modules. The power supply manager is configured to, when an anomaly is detected at any slot of the plurality of slots, identify, as one or more target slots, all one or more slots to which a module connected to the slot with the detected anomaly is connected, and stop powering the identified target slots.

7 Claims, 6 Drawing Sheets

MEASUREMENT APPARATUS, MEASUREMENT SYSTEM, AND PROGRAM

CROSS-REFERENCE TO RELATED APPLICATION

This application claims priority to Japanese Patent Application No. 2023-138434, filed on Aug. 28, 2023, the entire contents of which are incorporated herein by reference.

TECHNICAL FIELD

The present disclosure relates to a measurement apparatus, a measurement system, and a program.

BACKGROUND

Frame controllers to which a plurality of modules with various measurement functions can be connected are known. For example, modular measurement devices to which various types of plug-in modules, such as wavelength tunable light sources, optical power meters, optical attenuators, and optical switches, are connectable correspond to such frame controllers. The frame controller is generally provided with a plurality of slots to connect the modules, and operates each of the modules by powering the modules inserted into the slots.

Patent Literature (PTL) 1 and 2 describe technology for powering connected modules.

CITATION LIST

Patent Literature

PTL 1: JP 2002-125373 A
PTL 2: JP 2015-102901 A

SUMMARY

According to the present disclosure, a measurement apparatus includes:

a plurality of slots to which one or more modules are connectable;

a power supply manager configured to control powering the modules connected to the plurality of slots; and a display configured to display measurement signals acquired by the modules, wherein the power supply manager is configured to:

when an anomaly is detected at any slot of the plurality of slots, identify, as one or more target slots, all one or more slots to which a module connected to the slot with the detected anomaly is connected, and stop powering the identified target slots.

According to the present disclosure, a measurement system includes:

one or more modules; and a measurement apparatus configured to be connectable to the modules, the measurement apparatus including:

a plurality of slots to which the modules are connectable;

a power supply manager configured to control powering the modules connected to the plurality of slots; and a display configured to display measurement signals acquired by the modules, wherein the power supply manager is configured to:

when an anomaly is detected at any slot of the plurality of slots, identify, as one or more target slots, all one or more slots to which a module connected to the slot with the detected anomaly is connected, and stop powering the identified target slots.

According to the present disclosure, a program configured to control a measurement apparatus including:

a processor;

a plurality of slots to which one or more modules are connectable; and a display configured to display measurement signals acquired by the modules connected to the plurality of slots, the program configured to cause the processor to execute operations, the operations including:

when an anomaly is detected at any slot of the plurality of slots, identifying, as one or more target slots, all one or more slots to which a module connected to the slot with the detected anomaly is connected, and stopping powering the identified target slots.

DETAILED DESCRIPTION

Figure 1:
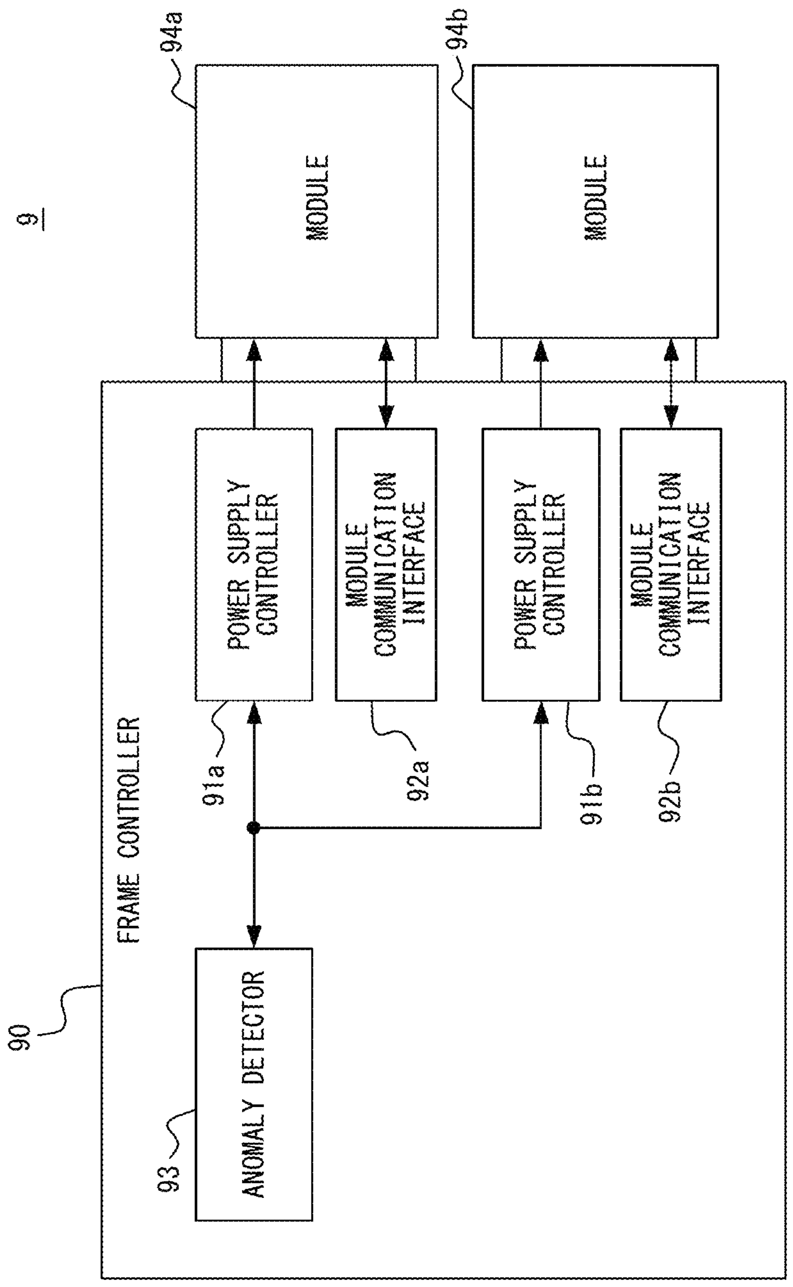
FIG. 1 is a diagram illustrating a configuration of a frame system according to a comparative example.

Conventional configurations have room for improvement in terms of support for multiple-slot-width modules, which are connected to a frame controller via multiple slots. For example, in the conventional configurations, multiple slots occupied by a multiple-slot-width module cannot be unpowered at the same time. Therefore, excessive current may flow through connectors of some of the slots, resulting in damage to internal circuits in the multiple-slot-width module.

It would be helpful to enable a frame controller to support multiple-slot-width modules.

According to the present disclosure, (1) a measurement apparatus includes:

a plurality of slots to which one or more modules are connectable;

a power supply manager configured to control powering the modules connected to the plurality of slots; and a display configured to display measurement signals acquired by the modules, wherein the power supply manager is configured to:

when an anomaly is detected at any slot of the plurality of slots, identify, as one or more target slots, all one or more slots to which a module connected to the slot with the detected anomaly is connected, and stop powering the identified target slots.

Thus, when the anomaly is detected at any slot of the plurality of slots, the measurement apparatus identifies all the slots to which the module connected to the slot with the detected anomaly is connected, and stops powering those slots. Accordingly, the measurement apparatus can stop powering the module connected to the slot with the detected anomaly at once. Therefore, the measurement apparatus can support multiple-slot-width modules, which are connected via multiple slots.

(2) The measurement apparatus according to (1) may further include:

a holder configured to hold a power supply control table that is information indicating, for each of the modules connected to the measurement apparatus, one or more slots to which that module is connected, wherein when an anomaly is detected at any slot of the plurality of slots, the power supply manager identifies the target slots, with reference to the power supply control table.

Thus, when the anomaly is detected at any of the plurality of slots, the power supply manager identifies the target slots, with reference to the power supply control table. Accordingly, the measurement apparatus can properly identify all the slots to which the module connected to the slot with the detected anomaly is connected, and stop powering those slots.

(3) In the measurement apparatus according to (2), the power supply manager may be configured to:

acquire, for each of the modules connected to the measurement apparatus, connector information including an arrangement of the one or more slots to connect that module to the measurement apparatus;

create the power supply control table based on the connector information on each of the modules connected to the measurement apparatus; and cause the holder to hold the created power supply control table.

Thus, the measurement apparatus creates the power supply control table based on the connector information on each of the modules connected, and identifies, using that power supply control table, the target slots that are to be unpowered. Therefore, the measurement apparatus can properly identify, according to the connection status of the modules, the target slots that are to be unpowered.

(4) In the measurement apparatus according to (3), the power supply manager may be configured to:

acquire, for each of the modules connected to the measurement apparatus, a model name of that module; and acquire the connector information based on the model name of each of the modules connected to the measurement apparatus.

Thus, the measurement apparatus acquires, based on the model names of the modules connected, the connector information on those modules. Therefore, the measurement apparatus can acquire the connector information corresponding to the modules, without excessive communications with the modules.

(5) In the measurement apparatus according to (3), the power supply manager may be configured to acquire, from each of the modules connected to the measurement apparatus, the connector information on that module.

Thus, the measurement apparatus acquires, from each of the modules connected, the connector information on that module. Therefore, the measurement apparatus can acquire the correct connector information corresponding to that module.

(6) The measurement apparatus according to any one of (1) to (5) may further include:

a plurality of power supply controllers provided in correspondence with the plurality of slots, each of the plurality of power supply controllers being configured to switch the presence or absence of powering a module connected to the corresponding slot, wherein the power supply manager may be configured to control powering the modules connected to the plurality of slots, by controlling the plurality of power supply controllers.

Thus, the measurement apparatus is provided with, for each slot, the power supply controller that switches the presence or absence of powering the module connected, and the power supply manager controls powering the modules, by controlling the power supply controllers. Therefore, the measurement apparatus can easily switch powering each slot, in response to the slot at which the anomaly has been detected.

(7) The measurement apparatus according to (6), may further include:

an anomaly detector configured to detect, based on information acquired from the plurality of power supply controllers, an anomaly related to powering the modules connected to the plurality of slots, wherein when an anomaly is detected by the anomaly detector at any slot of the plurality of slots, the power supply manager may identify, as the target slots, all one or more slots to which a module connected to the slot with the detected anomaly is connected.

Thus, the measurement apparatus detects the anomaly by the anomaly detector, which detects the anomaly related to powering the modules connected to the plurality of slots. Therefore, the measurement apparatus can properly detect the anomaly at each slot, and switch the powering.

(8) The measurement apparatus according to any one of (1) to (7), may further include:

a plurality of module communication interfaces provided in correspondence with the plurality of slots, each of the plurality of module communication interfaces being configured to communicate with a module connected to the corresponding slot, wherein when any mobile communication interface of the plurality of module communication interfaces has received anomaly information indicating an anomaly, from a module that has communicated with the module communication interface, the power supply manager may identify, as the target slots, all one or more slots to which the module connected to a slot corresponding to the module communication interface is connected.

Thus, the measurement apparatus detects the anomaly based on the reception of the anomaly information from the module, and therefore can properly switch the powering in response to the anomaly on the module side.

According to the present disclosure, (9) a measurement system includes:

one or more modules; and a measurement apparatus configured to be connectable to the modules, the measurement apparatus including:

a plurality of slots to which the modules are connectable;

a power supply manager configured to control powering the modules connected to the plurality of slots; and a display configured to display measurement signals acquired by the modules, wherein the power supply manager is configured to:

when an anomaly is detected at any slot of the plurality of slots, identify, as one or more target slots, all one or more slots to which a module connected to the slot with the detected anomaly is connected, and stop powering the identified target slots.

Thus, when the anomaly is detected at any of the plurality of slots, the measurement system identifies all the slots to which the module connected to the slot with the detected anomaly is connected, and stops powering those slots. Accordingly, the measurement system can stop powering the module connected to the slot with the detected anomaly at once. Therefore, the measurement system can support multiple-slot-width modules, which are connected via multiple slots.

According to the present disclosure,

(10) a program configured to control a measurement apparatus including:

a processor;

a plurality of slots to which one or more modules are connectable; and a display configured to display measurement signals acquired by the modules connected to the plurality of slots, the program is configured to cause the processor to execute operations, the operations including:

when an anomaly is detected at any slot of the plurality of slots, identifying, as one or more target slots, all one or more slots to which a module connected to the slot with the detected anomaly is connected, and stopping powering the identified target slots.

Thus, when the anomaly is detected at any of the plurality of slots, the measurement apparatus, which operates based on the program, identifies all the slots to which the module connected to the slot with the detected anomaly is connected, and stops powering those slots. Accordingly, the measurement apparatus can stop powering the module connected to the slot with the detected anomaly at once. Therefore, the measurement apparatus can support multiple-slot-width modules, which are connected via multiple slots.

According to embodiments of the present disclosure, the frame controller can support the multiple-slot-width modules.

Comparative Example

FIG. 1 is a diagram illustrating a configuration of a frame system 9 according to a comparative example. The frame system 9 includes a frame controller 90 according to the comparative example and modules 94 (94*a* and 94*b*). The frame controller 90 according to the comparative example has a plurality of slots in which the modules 94 can be installed. The modules 94 provide various information, such as measurement values, to the frame controller 90. Each module 94 has a connector for connection to the frame controller 90. A user connects the connectors of the modules 94 to the frame controller 90, by installing the modules 94 in the slots.

The connector of each module 94 has signal lines through which electric power, as drive power, and operation control signals are received from the frame controller 90. The modules 94 connected to the frame controller 90 perform operations according to the types of the modules 94, e.g., acquire electrical signals indicating measurement values of various physical quantities based on the operation control signals. The modules 94 transmit, to the frame controller 90, information on the measurement values of the physical quantities acquired through the connectors.

The frame controller 90 according to the comparative example includes power supply controllers 91 (91*a* and 91*b*), module communication interfaces 92 (92*a* and 92*b*), and an anomaly detector 93. The frame controller 90 has one power supply controller 91 (91*a* or 91*b*) and one module communication interface 92 (92*a* or 92*b*) for each slot.

Each power supply controller 91, as a drive power supply, has the function of switching the presence or absence of powering the module 94 installed in the corresponding slot. Each power supply controller 91 also has the function of acquiring information on voltage, current, and the like, with respect to powering the module 94, as the drive power supply.

Each module communication interface 92 has the functions of acquiring information, including a model name of the module 94, and controlling operations of the module 94, by communicating with the module 94. The information that each module communication interface 92 transmits to and receives from the module 94 includes a signal for the frame controller 90 to recognize the insertion and removal of the module 94.

The anomaly detector 93 has the function of detecting an anomaly at each slot, based on the information acquired by the power supply controllers 91. Upon detecting an anomaly in powering a certain slot, the anomaly detector 93 can stop powering the slot by controlling the power supply controller 91 corresponding to the slot.

In the configuration described above, the power supply controllers 91 detect the slots in which the modules 94 are installed, and start powering the modules 94 installed in the slots. Next, the module communication interfaces 92 acquire the model names of the connected modules 94 by communicating with the connected modules 94. The anomaly detector 93 constantly monitors each of the power supply controllers 91. Upon detecting an anomaly in the power supply controller 91 for any slot, the anomaly detector 93 commands the power supply controller 91 for that slot to stop powering the module 94.

Here, a situation in which a multiple-slot-width module is connected to the frame controller 90 according to the comparative example is considered. The multiple-slot-width module is a module that occupies multiple slots. The multiple-slot-width module may have multiple connectors and be connected to the frame controller 90 via the multiple slots.

In the multiple-slot-width module, there is an upper limit to the amount of current that can flow per connector. Therefore, for the purpose of securing power supply capacity, it is conceivable to connect power supplies of the frame controller 90 in parallel to the multiple connectors, to perform powering in parallel. In such a multiple-slot-width module to which the power supplies are internally connected in parallel, when the timing of a start and stop of powering differs from connector to connector, the current may concentrate at a connector at which the powering stops late, resulting in damage to internal circuits. Therefore, the start and stop of powering the multiple-slot-width module must be performed at the same time, for all the connectors, from the viewpoint of preventing damage to the multiple-slot-width module.

However, when the multiple-slot-width module is connected to the frame controller 90 according to the comparative example, the multiple connectors cannot be unpowered at the same time. Therefore, it is conceivable, in the frame controller 90 according to the comparative example, to prohibit the parallel connection of the power supplies. However, even when the power supplies are not connected in parallel inside the multiple-slot-width module, the internal circuits may be damaged unless all the connectors are unpowered at the same time. For example, when a signal is transmitted to a circuit connected to a connector that has already been unpowered, the circuit may be damaged due to latch-up or other reasons. Therefore, in the frame controller 90 according to the comparative example, even when the parallel connection of the power supplies is prohibited, there are design restrictions from the viewpoint of preventing damage to the internal circuits.

Thus, the frame controller 90 according to the comparative example has room for improvement in terms of support for multiple-slot-width modules.

Embodiments

An embodiment of the present disclosure will be described below with reference to the drawings. In each drawing, parts having the same configuration or function are denoted with the same reference numeral. In the description of the present embodiment, duplicate descriptions of the same parts may be omitted or simplified as appropriate.

Figure 2:
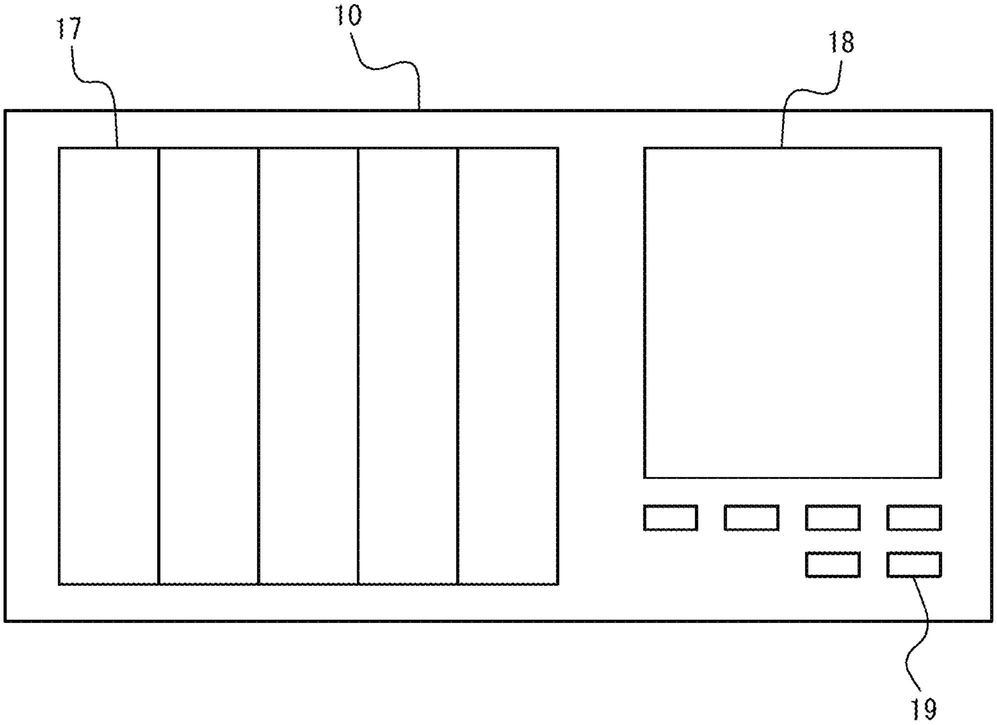
FIG. 2 is a diagram illustrating an example of the appearance of a frame controller according to an embodiment.
Figure 3:
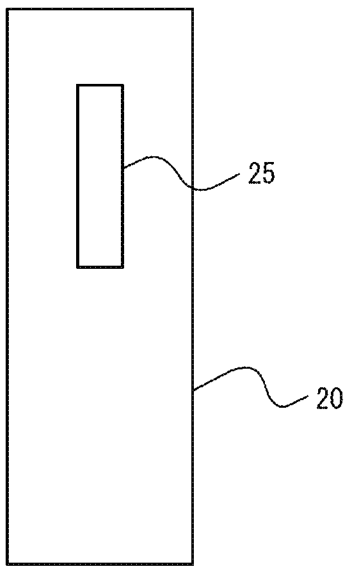
FIG. 3 is a diagram illustrating an example of the appearance of a module according to the embodiment.
Figure 4:
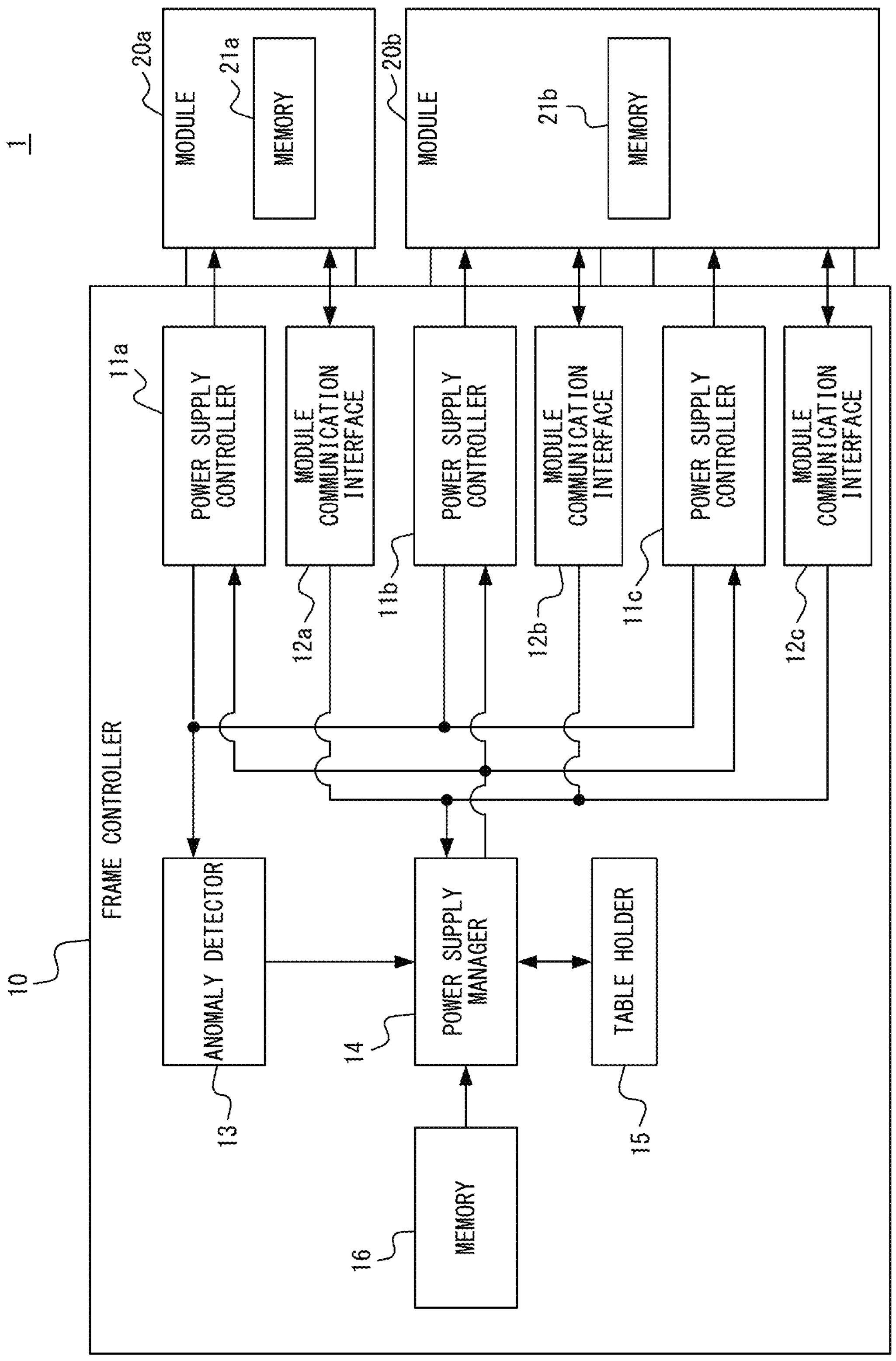
FIG. 4 is a block diagram illustrating an example of a configuration of a frame system according to the embodiment.

FIG. 2 is a diagram illustrating an example of the appearance of a frame controller 10 according to the embodiment. FIG. 3 is a diagram illustrating an example of the appearance of a module 20 according to the embodiment. FIG. 4 is a block diagram illustrating an example of a configuration of a frame system 1 according to the embodiment. As illustrated in FIG. 4, the frame system 1, as a measurement system, includes the frame controller 10 and the modules 20.

As illustrated in FIG. 2, the frame controller 10, as a measurement apparatus, includes a plurality of slots 17, a display 18, and an operation unit 19.

The slots 17 are insertion ports into which the modules 20 are installed. To the slots 17, the modules 20 are connectable. The frame controller 10 may be provided, inside the slots 17, with connection portions for establishing electrical and mechanical connection to connectors 25 (see FIG. 3) of the modules 20.

The display 18 is a monitor that displays information to a user. The display 18 displays, for example, waveforms of signals acquired by the modules 20. The display 18 may be, for example, a liquid crystal panel display, an organic electro luminescence (EL) display, or the like. The display 18 may be configured as a touch screen (touch panel) integrated with the operation unit 19.

The operation unit 19 includes one or more input interfaces that accept operations from the user. The operation unit 19 includes, for example, physical keys, capacitive keys, a pointing device, a touch screen integrated with the display 18, or the like, but is not limited to these. At least one of the display 18 or the operation unit 19 described above may be configured integrally with the frame controller 10, or may be configured as a separate unit.

The modules 20 provide information, such as measurement values, to the frame controller 10. The modules 20 may be a variety of plug-in modules, for example, a variable wavelength light source, optical power meter, optical attenuator, optical switch, and the like. Alternatively, the modules 20 may acquire electrical measurement values, such as voltage, current, or power, as well as signals (measurement signals) related to measurement values of physical quantities other than light, such as temperature, pressure, flow rate, strain, acceleration, pH, or humidity.

As illustrated in FIG. 3, each module 20 includes a connector 25. The connector 25 can be electrically and mechanically connected to the connection portion provided inside the slot 17 of the frame controller 10. The user connects the connector 25 of the module 20 to the frame controller 10 by installing the module 20 in the slot 17.

The connector 25 of the module 20 has signal lines through which electric power, as drive power, and operation control signals are received from the frame controller 10. The modules 20 connected to the frame controller 10 acquire electrical signals that indicate measurement values of various physical quantities based on the operation control signals. The modules 20 transmit the acquired measurement signals of the physical quantities to the frame controller 10 via the connectors 25. The frame controller 10 displays, on the display 18, the waveforms of the measurement values of the physical quantities provided by the modules 20.

Although the module 20 illustrated in FIG. 3 occupies one slot 17 when connected to the frame controller 10, the module 20 may occupy multiple slots 17 when connected to the frame controller 10. As described above, a module 20 that occupies multiple slots 17 is referred to as a "multiple-slot-width module". The multiple-slot-width module may have multiple connectors 25 and may be connected to the frame controller 10 via the multiple slots 17. The number of slots 17 occupied by the multiple-slot-width module, when the multiple-slot-width module is connected to the frame controller 10, may not be the same as the number of connectors 25 provided in the multiple-slot-width module. For example, the multiple-slot-width module may have a portion that occupies the slot 17 but has no connector 25 corresponding to that slot 17.

FIG. 4 illustrates an example in which two of the modules 20 (20*a* and 20*b*) are connected to the frame controller 10. A module 20*a* has a shape that occupies one slot 17 and has one connector 25. A module 20*b* has a shape that occupies two slots 17 and has two connectors 25. The module 20*b* corresponds to the multiple-slot-width module.

As illustrated in FIG. 4, the frame controller 10 includes, as a configuration inside the apparatus, power supply controllers 11 (11*a*, 11*b*, and 11*c*), module communication interfaces 12 (12*a*, 12*b*, and 12*c*), an anomaly detector 13, a power supply manager 14, a table holder 15, and a memory 16. The frame controller 10 is provided with one power supply controller 11 (11*a*, 11*b*, or 11*c*) and one module communication interface 12 (12*a*, 12*b*, or 12*c*) for each slot 17. In the example in FIG. 4, the module 20*a* is connected to the power supply controller 11*a* and the module communication interface 12*a* via the connector 25. The module 20*b* is connected to the power supply controllers 11*b* and 11*c* and the module communication interfaces 12*b* and 12*c* via the connectors 25.

The power supply controller 11, as a drive power supply, has the function of switching the presence or absence of powering the module 20 installed in the corresponding slot 17, based on the control of the power supply manager 14. The power supply controller 11 also has the function of acquiring information on voltage, current, and the like, with respect to powering the module 20, as the drive power supply.

The module communication interface 12 has the functions of acquiring information, including a model name of the module 20, and controlling operations of the module 20, by communicating with the module 20. The information that the module communication interface 12 transmits to and receives from the module 20 includes a signal for the frame controller 10 to recognize the insertion and removal of the module 20. The module communication interface 12 has the function of notifying the power supply manager 14 of the model name acquired from the module 20.

The anomaly detector 13 has the function of detecting an anomaly at each slot 17, based on the information acquired by the power supply controllers 11. The anomaly detector 13 notifies the power supply manager 14 of the detected anomaly information. The anomaly information may include, for example, the slot number of the slot 17 at which the anomaly has been detected, the type of anomaly, and the like. The type of anomaly may include, for example, an anomaly in power supply current, voltage, or electric power to the module 20, a user operation anomaly, an input/output anomaly to the module 20, and the like.

The table holder 15, as a holder, holds a power supply control table. The power supply control table is information that indicates, for each of the modules 20 connected to the frame controller 10, the slot/slots 17 to which that module 20 is connected via the connector/connectors 25. An example of the power supply control table will be described below with reference to FIG. 6.

The memory 16 stores connector information. The connector information is information that indicates the correspondence between the model name of the module 20, and the slot width of the slot/slots 17 occupied by that module 20 identified by that model name and the arrangement of the slot/slots 17 connected to the connector/connectors 25 in that slot width. The slot width is the number of slot/slots 17 occupied by the module 20. For example, the slot width of the module 20*a* in FIG. 4 is 1. The slot width of the module 20*b* is 2. For example, when "1" represents the presence of connection to the connector 25 and "0" represents the absence of connection, the arrangement of the slot 17 connected to the connector 25 of the module 20*a* can be expressed as [1]. The arrangement of the slots 17 connected to the connectors 25 of the module 20*b* can be represented as [11].

As illustrated in FIG. 4, each module 20 (20*a* or 20*b*) has a memory 21 (21*a* or 21*b*). The memory 21 of the module 20 stores the connector information on that module 20. That is, the connector information stored in the memory 21 of the module 20 is information indicating the model name of that module 20, the slot width of the slot/slots 17 occupied by that module 20, and the arrangement of the slot/slots 17 connected to the connector/connectors 25 in that slot width. The frame controller 10 acquires the connector information from the module 20 in response to the connection of the module 20. When the acquired connector information is not stored in the memory 16, the frame controller 10 adds that connector information to the memory 16.

The power supply manager 14 has the function of managing operations of the power supply controllers 11 (11*a*, 11*b*, and 11*c*) for the individual slots 17. Specifically, in response to the connection of the modules 20, the power supply manager 14 creates the power supply control table from the model name information on those modules 20 acquired via the module communication interfaces 12 and the connector information stored in the memory 16, and causes the table holder 15 to hold the power supply control table.

When the anomaly detector 13 has detected an anomaly at any one of the slots 17, the power supply manager 14 identifies all the slot/slots 17 that the module 20 connected to the slot 17 with the detected anomaly uses, with reference to the power supply control table. The power supply manager 14 controls the power supply controller/controllers 11 corresponding to the identified slot/slots 17, in order to stop the powering from the power supply controller/controllers 11. Thus, when the multiple-slot-width module is connected, the frame controller 10 according to the present embodiment can stop powering the multiple connectors 25 of that multiple-slot-width module at the same time. Therefore, the frame controller 10 can support the multiple-slot-width modules.

In the present embodiment, each component illustrated as a block in FIG. 4 is realized by separate hardware, but is not limited to such a configuration. For example, two or more components may be realized by common hardware. Specifically, for example, the table holder 15 and the memory 16 may be configured in the same memory. Also, at least part of each component illustrated in FIG. 4 may be realized by a general purpose processor executing a program. In other words, at least part of each component illustrated in FIG. 4 may be realized by software. For example, the anomaly detector 13 and the power supply manager 14 may be realized by software. Each of the frame controller 10 and modules 20 may be realized by a single apparatus or by cooperation of a plurality of apparatuses.

Figure 5:
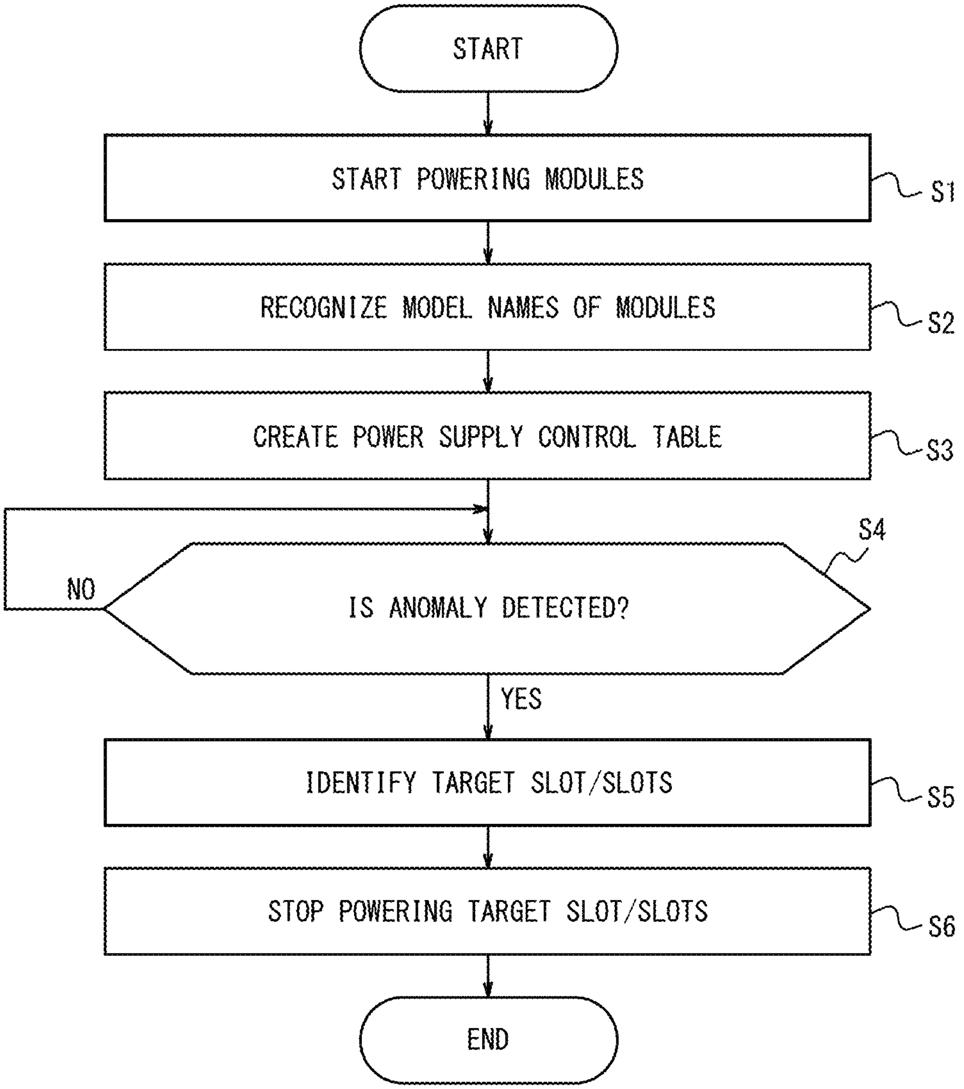
FIG. 5 is a flowchart illustrating an example of operations of the frame controller according to the embodiment.

FIG. 5 is a flowchart illustrating an example of operations of the frame controller 10 according to the embodiment. The operations of the frame controller 10 described with reference to FIG. 5 may correspond to one of control methods of the frame controller 10. An operation of each step in FIG. 5 may be performed under the control of the power supply manager 14 of the frame controller 10. An example in which the operations in FIG. 5 start with the two modules 20 (20*a* and 20*b*) connected to the slots 17 of the frame controller 10, as illustrated in FIG. 4, will be described below.

In step S1, the power supply manager 14 starts powering each of the modules 20 connected to the frame controller 10. Specifically, for example, the power supply manager 14 controls the power supply controller 11*a* to start powering the module 20*a*. The power supply manager 14 controls the power supply controllers 11*b* and 11*c* to start powering the module 20*b*.

In step S2, the power supply manager 14 acquires the model name from each of the modules 20 connected to the frame controller 10. Specifically, the power supply manager 14 controls the module communication interfaces 12*a*, 12*b*, and 12*c*, for example, to acquire the model names of the modules 20*a* and 20*b* from the modules 20. The power supply manager 14 determines, with reference to the memory 16, whether the connector information regarding each model name is stored in the memory 16. When the connector information is not stored in the memory 16, the power supply manager 14 adds the connector information on that module 20 to the memory 16.

In step S3, the power supply manager 14 creates the power supply control table based on the model names recognized in step S2. Specifically, the power supply manager 14 acquires, for each of the modules 20 connected to the frame controller 10, the slot width and the arrangement of the slot/slots 17 to be connected to the connector/connectors 25, with reference to the connector information stored in the memory 16. The power supply manager 14 creates the power supply control table based on the acquired slot widths and arrangements of the slots 17 to be connected.

Figure 6:
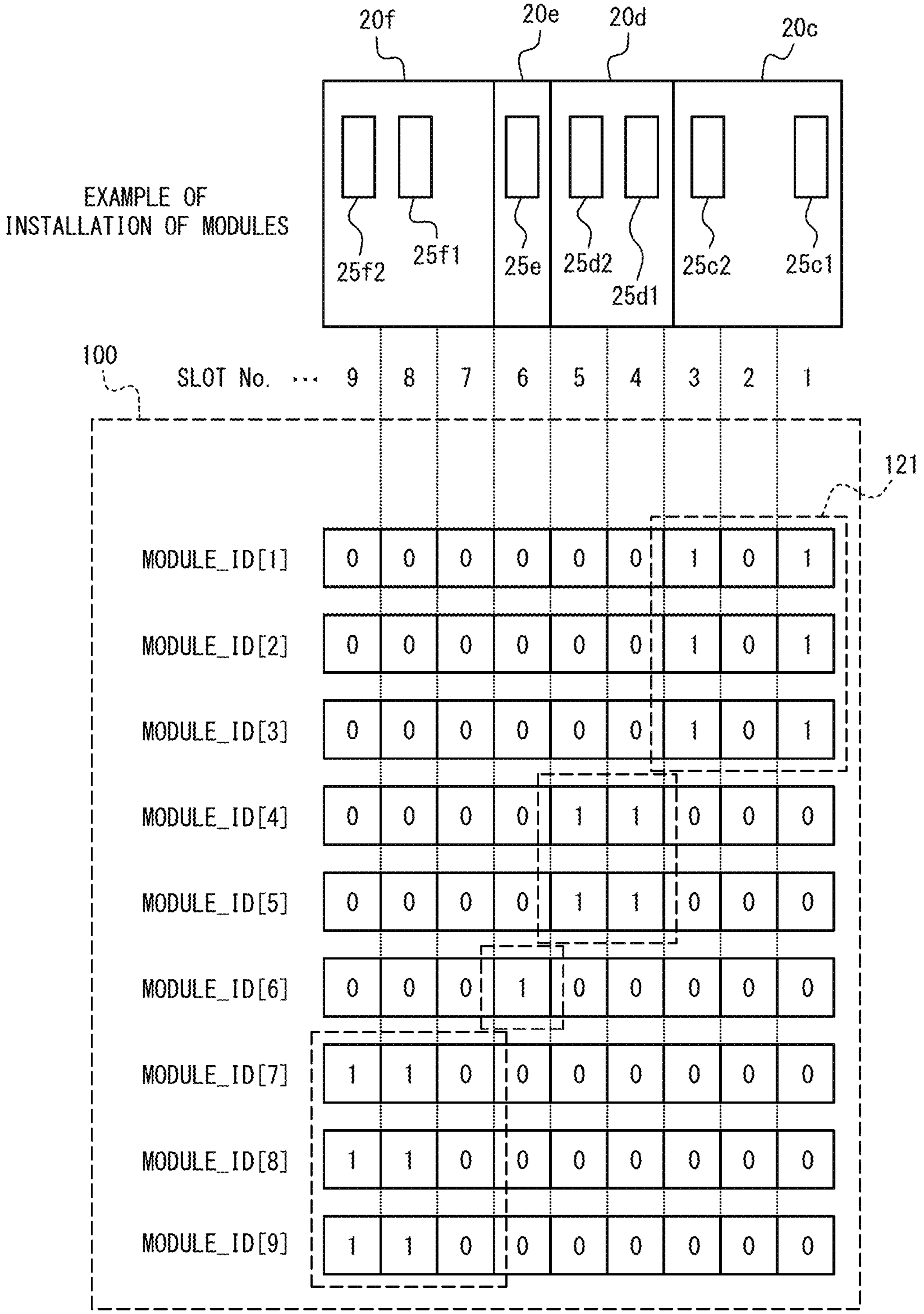
FIG. 6 is a diagram illustrating an example of module installation and an example of a power supply control table.

FIG. 6 is a diagram illustrating an example of installation of the modules 20 and an example of a power supply control table 100. In the example in FIG. 6, the frame controller 10 has nine slots 17. The nine slots 17 are identified by slot numbers (Slot No.) "1" to "9". In the example in FIG. 6, four modules 20*c*, 20*d*, 20*e*, and 20*f* are connected to the frame controller 10. The slot width of the module 20*c* is 3. The module 20*c* occupies the slots 17 of the slot numbers "1" to "3". The arrangement of the slots 17 connected to connectors 25*c*1 and 25*c*2 of the module 20*c* can be represented as [101]. The slot width of the module 20*d* is 2. The module 20*d* occupies the slots 17 of the slot numbers "4" and "5". The arrangement of the slots 17 connected to connectors 25*d*1 and 25*d*2 of the module 20*d* can be represented as [11]. The slot width of the module 20*e* is 1. The module 20*e* occupies the slot 17 of the slot number "6". The arrangement of the slot 17 connected to a connector 25*e* of the module 20*e* can be represented as [1]. The slot width of the module 20*f* is 3. The module 20*f* occupies the slots 17 of the slot numbers "7" to "9". The arrangement of the slots 17 connected to connectors 25*f*1 and 25*f*2 of the module 20*f* can be represented as [011].

In the power supply control table 100 in FIG. 6, MODULE_ID [n] indicates, with a bit "1", the connection status of all the slot/slots 17 to which the connector/connectors 25 of the module 20 that occupies a slot number "n" is/are connected, and with a bit "0", the connection status of the other slots 17. Here, n is a natural number (n: 1, 2, . . . ).

For example, the slots 17 of the slot numbers "1" to "3" are occupied by the module 20*c*. The connectors 25*c*1 and 25*c*2 of the module 20*c* are connected to the slots 17 of the slot numbers "1" and "3". Therefore, as illustrated in FIG. 6, MODULE_ID [1] to MODULE_ID [3] are all [0000001]. Here, the lower three bits (121) of MODULE_ID [1] to MODULE_ID [3] are the same as the arrangement of the slots 17 that are to be connected to the connectors 25*c*1 and 25*c*2 of the module 20*c*. In the same manner, the slots 17 of the slot numbers "4" and "5" are occupied by the module 20*d*. The connectors 25*d*1 and 25*d*2 of the module 20*d* are connected to the slots 17 of the slot numbers "4" and "5". Therefore, MODULE_ID [4] and MODULE_ID [5] are both [000011000]. The slot 17 of the slot number "6" is occupied by the module 20*e*. The connector 25*e* of the module 20*e* is connected to the slot 17 of the slot number "6". Therefore, MODULE_ID [6] is [000100000]. The slots 17 of the slot numbers "7" to "9" are occupied by the module 20*f*. The connectors 25*f*1 and 25*f*2 of the module 20*f* are connected to the slots 17 of the slot numbers "8" and "9". Therefore, MODULE_ID [7] to MODULE_ID [9] are all [110000000].

The power supply manager 14 may create the power supply control table from the connector information acquired from the modules 20 via the module communication interfaces 12.

Return to the explanation in FIG. 5. In step S4, the power supply manager 14 determines whether the anomaly detector 13 has detected an anomaly in any of the slots 17. Specifically, the power supply manager 14 may determine that the anomaly has been detected when the anomaly information is received from the anomaly detector 13. When the anomaly has been detected (YES in step S4), the power supply manager 14 proceeds to step S5, otherwise (NO in step S4), the power supply manager 14 waits as is.

In step S5, the power supply manager 14 identifies, as one or more target slots, all the slot/slots 17 to which the connector/connectors 25 of the module 20 connected to the slot 17 with the detected anomaly is/are connected. The target slot/slots is/are the slot/slots 17 that should be unpowered. Specifically, the power supply manager 14 identifies, with reference to the anomaly information received from the anomaly detector 13 in step S4, the slot number of the slot 17 at which the anomaly has been detected. The power supply manager 14 identifies, with reference to the power supply control table, all the slot/slots 17 to which the connector/connectors 25 of the module 20 connected to the slot 17 of the identified slot number is/are connected.

For example, in a case in which the power supply controller table is represented in FIG. 6, assume that the anomaly detector 13 has detected an anomaly at the slot 17 of the slot number "3". In this case, the power supply manager 14 refers to MODULE_ID [3], which indicates the connection relationship for the slot 17 of the slot number "3". Since MODULE_ID [3]=[000000101], the power supply manager 14 identifies the slots 17 of the slot numbers "1" and "3", as the target slots.

In step S6, the power supply manager 14 controls the power supply controller/controllers 11 corresponding to the target slot/slots to stop powering all the target slot/slots identified in step S5 at the same time. As a result, all the connector/connectors 25 connected to the slot 17 at which the anomaly has occurred is/are unpowered at the same time. After completing the process of step S6, the power supply manager 14 ends the processes of the flowchart illustrated in FIG. 5.

As described above, the frame controller 90 according to the comparative example can shut off the powering of only the slot at which the anomaly has been detected. In contrast, the frame controller 10, as the measurement apparatus according to the present embodiment, when the anomaly has been detected at any of the plurality of slots 17, identifies, as the target slot/slots, all the slot/slots 17 to which the module 20 connected to the slot 17 with the detected anomaly is connected. The frame controller 10 stops powering the target slot/slots. Therefore, the frame controller 10 can stop powering the module 20 connected to the slot 17 with the detected anomaly at once.

The frame controller 10 also identifies, using the power supply control table, the slot/slots 17 that is/are to be unpowered at the same time. Therefore, according to the frame controller 10, unpowering can be properly performed without depending on the combination of the types of the modules 20, the positions of the slots 17 in which the modules 20 are installed, the position of the slot 17 at which the anomaly has occurred, and the like. In the frame controller 10, the power supply manager 14 has control over the operations of the individual power supply controllers 11. Therefore, even when anomalies occur simultaneously at the multiple slots 17 to which the multiple-slot-width module is connected, an abnormal operation e.g. double unpowering can be prevented. Furthermore, according to the frame controller 10, even when anomalies occur simultaneously at the different multiple modules 20, those modules 20 can be unpowered at the same time.

Thus, according to the frame controller 10, it is possible to connect the power supplies from the connectors 25 in parallel inside the multiple-slot-width module 20, thus increasing load current capacity within the single multiple-slot-width module 20. According to the frame controller 10, even when the power supplies are not connected in parallel, the risk of failure can be reduced when there are communications and connections of control signals between the slots 17 within the multiple-slot-width module 20.

Figure 7:
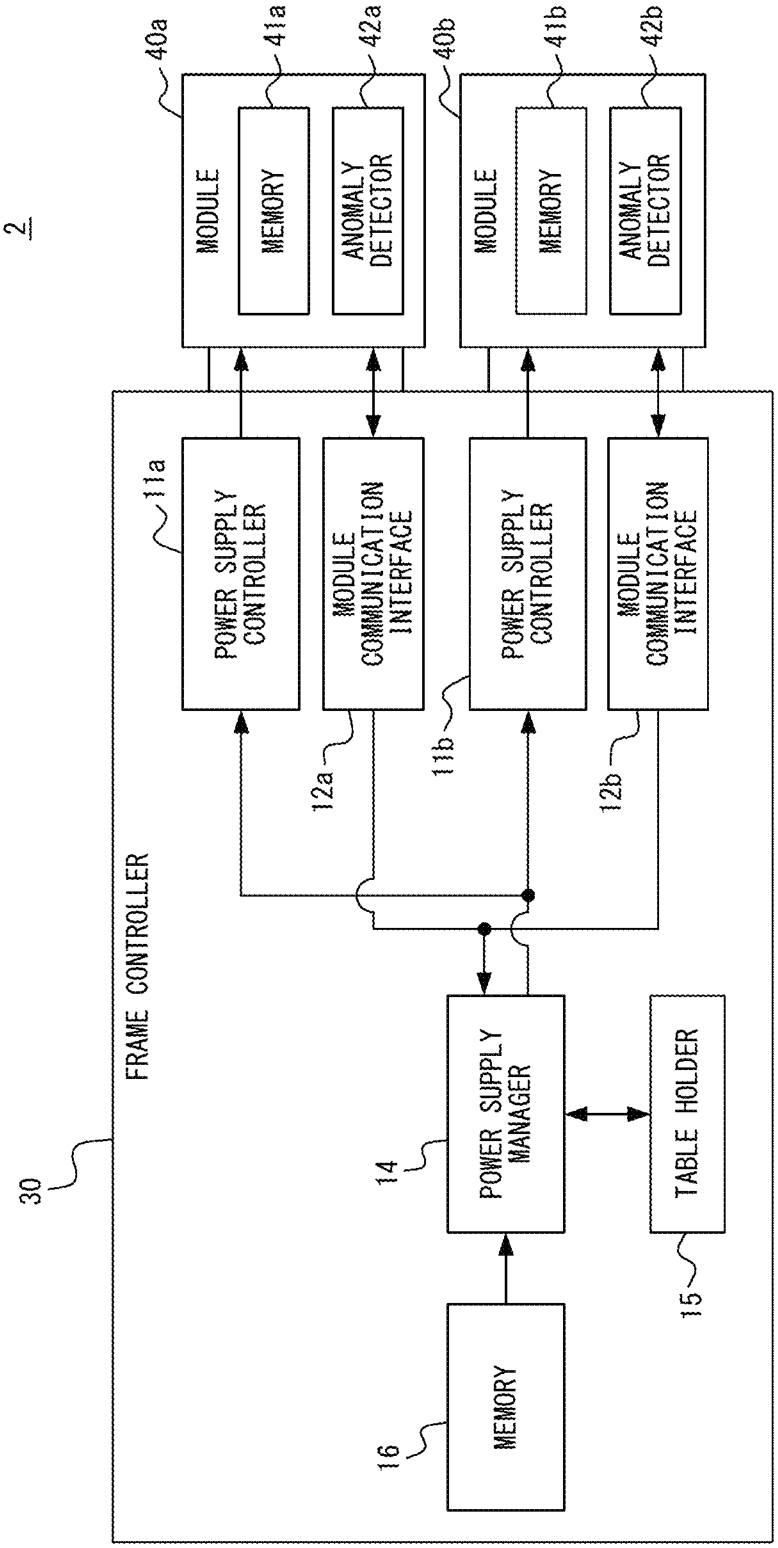
FIG. 7 is a block diagram illustrating an example of a configuration of a frame system according to another embodiment.

In the frame system 1 described with reference to FIG. 4, the frame controller 10 includes the anomaly detector 13, but the anomaly detector may be provided on the module side. Such a configuration will be described with reference to FIG. 7. Hereafter, parts common to those in FIG. 4 are denoted with the same reference numerals, and detailed descriptions thereof are omitted. FIG. 7 is a block diagram illustrating an example of a configuration of a frame system 2 according to another embodiment. The frame system 2 includes a frame controller 30 and modules 40 (40*a* and 40*b*). As illustrated in FIG. 7, the frame controller 30 has, as an internal configuration of the apparatus, power supply controllers 11 (11*a* and 11*b*), module communication interfaces 12 (12*a* and 12*b*), a power supply manager 14, a table holder 15, and a memory 16. Each modules 40 (40*a* or 40*b*) includes a memory 41 (41*a* or 41*b*) and an anomaly detector 42 (42*a* or 42*b*).

In the example of the configuration in FIG. 7, the frame controller 30 is not provided with an anomaly detector. The anomaly detector 42 provided in each module 40 detects an anomaly within the module 40. When the anomaly detector 42 detects an anomaly, the module 40 notifies the power supply manager 14 of the detected anomaly information, through a connector 25 and the module communication interface 12. The anomaly information may include, for example, the slot number of a slot 17 at which the anomaly has been detected, the type of anomaly, and the like. The type of anomaly may include, for example, as well as an anomaly in power supply current, voltage, or electric power to the module 40, a user operation anomaly, and an input/output anomaly to the module 40, an anomaly in internal temperature in the module 40, internal air pressure in the module 40, or internal FAN alarm in the module 40, a user operation anomaly to the module 40, an anomaly in vibration or shock in the module 40, and an anomaly in internal humidity (condensation) in the module 40.

In such a configuration, the power supply manager 14 detects the anomaly based on the receipt of the anomaly information from the module 40. Therefore, the frame controller 30 can properly switch the powering in response to the anomaly on the module 40 side. Note that, both of the frame controller 10 or 30 and the modules 20 or 40 may be provided with the anomaly detectors, and the power supply manager 14 may switch the powering in response to an anomaly detected by any of these anomaly detectors.

The present disclosure is not limited to the embodiments described above. For example, the plurality of blocks illustrated in the block diagrams may be integrated, or one block may be divided. The plurality of steps illustrated in the flowchart may be executed in parallel or in a different order, instead of being executed in chronological order according to the description, depending on the processing capability of the apparatus performing each step or as needed. Other variations may be possible to the extent of not departing from the intent of the present disclosure.

The invention claimed is:

1. A measurement apparatus comprising:
- a plurality of slots to which one or more modules are connectable;
- a power supply manager configured to control powering the modules connected to the plurality of slots;
- a display configured to display measurement signals acquired by the modules; and
- a holder configured to hold a power supply control table that is information indicating, for each of the modules connected to the measurement apparatus, one or more slots to which that module is connected, wherein the power supply manager is configured to:
- when an anomaly is detected at any slot of the plurality of slots, identify, as one or more target slots, all one or more slots to which a module connected to the slot with the detected anomaly is connected, with reference to the power supply control table, and
- stop powering the identified target slots.

2. The measurement apparatus according to claim 1, wherein the power supply manager is configured to:
- acquire, for each of the modules connected to the measurement apparatus, connector information including an arrangement of the one or more slots to connect that module to the measurement apparatus;
- create the power supply control table based on the connector information on each of the modules connected to the measurement apparatus; and
- cause the holder to hold the created power supply control table.

3. The measurement apparatus according to claim 2, wherein the power supply manager is configured to:
- acquire, for each of the modules connected to the measurement apparatus, a model name of that module; and
- acquire the connector information based on the model name of each of the modules connected to the measurement apparatus.

4. The measurement apparatus according to claim 2, wherein the power supply manager is configured to acquire, from each of the modules connected to the measurement apparatus, the connector information on that module.

5. A measurement apparatus comprising:
- a plurality of slots to which one or more modules are connectable;
- a power supply manager configured to control powering the modules connected to the plurality of slots; and
- a display configured to display measurement signals acquired by the modules, wherein the power supply manager is configured to:
- when an anomaly is detected at any slot of the plurality of slots, identify, as one or more target slots, all one or more slots to which a module connected to the slot with the detected anomaly is connected, and
- stop powering the identified target slots, wherein the measurement apparatus further comprises:
- a plurality of power supply controllers provided in correspondence with the plurality of slots, each of the plurality of power supply controllers being configured to switch presence or absence of powering a module connected to the corresponding slot, wherein the power supply manager is configured to control powering the modules connected to the plurality of slots, by controlling the plurality of power supply controllers.

6. The measurement apparatus according to claim 5, further comprising:
- an anomaly detector configured to detect, based on information acquired from the plurality of power supply controllers, an anomaly related to powering the modules connected to the plurality of slots, wherein when an anomaly is detected by the anomaly detector at any slot of the plurality of slots, the power supply manager identifies, as the target slots, all one or more slots to which a module connected to the slot with the detected anomaly is connected.

7. A measurement apparatus comprising:
- a plurality of slots to which one or more modules are connectable;
- a power supply manager configured to control powering the modules connected to the plurality of slots; and
- a display configured to display measurement signals acquired by the modules, wherein the power supply manager is configured to:

when an anomaly is detected at any slot of the plurality of slots, identify, as one or more target slots, all one or more slots to which a module connected to the slot with the detected anomaly is connected, and stop powering the identified target slots, wherein the measurement apparatus further comprises:

a plurality of module communication interfaces provided in correspondence with the plurality of slots, each of the plurality of module communication interfaces being configured to communicate with a module connected to the corresponding slot, wherein when any mobile communication interface of the plurality of module communication interfaces has received anomaly information indicating an anomaly, from a module that has communicated with the module communication interface, the power supply manager identifies, as the target slots, all one or more slots to which the module connected to a slot corresponding to the module communication interface is connected.

* * * * *